US005159228A

United States Patent [19]

Schaetzle

[11] Patent Number: 5,159,228

[45] Date of Patent: Oct. 27, 1992

[54] PRESSURE WAVE SENSOR

[75] Inventor: Ulrich Schaetzle, Erlangen, Fed. Rep. of Germany

[73] Assignee: Siemens Aktiengesellschaft, Munich, Fed. Rep. of Germany

[21] Appl. No.: 743,231

[22] Filed: Aug. 9, 1991

[30] Foreign Application Priority Data

Aug. 24, 1990 [EP] European Pat. Off. ........... 90116268

[51] Int. Cl.$^5$ ............................................ H01L 41/08

[52] U.S. Cl. .................................... 310/338; 310/800; 310/340

[58] Field of Search ............... 310/334, 335, 338, 339, 310/340, 345, 364, 860

[56] References Cited

U.S. PATENT DOCUMENTS

| | | | |
|---|---|---|---|
| 3,912,830 | 10/1975 | Murayama et al. | 310/800 X |
| 4,158,117 | 6/1979 | Quilliam | 310/800 X |
| 4,360,562 | 11/1982 | Endo et al. | 310/800 X |
| 4,370,182 | 1/1983 | Becker et al. | 310/800 X |
| 4,433,400 | 2/1984 | De Reggi et al. | 310/800 X |
| 4,512,431 | 4/1985 | Bloomfield | 310/800 X |
| 4,555,953 | 12/1985 | Dario et al. | 310/800 X |
| 4,609,845 | 9/1986 | Soni et al. | 310/800 X |
| 4,734,611 | 3/1988 | Granz | 310/334 |
| 4,824,107 | 4/1989 | French | 310/800 X |
| 4,911,172 | 3/1990 | Bui et al. | 310/324 |
| 4,984,222 | 1/1991 | Beauducel et al. | 367/159 |

*Primary Examiner*—Mark O. Budd
*Attorney, Agent, or Firm*—Hill, Van Santen, Steadman & Simpson

[57] ABSTRACT

An ultrasound sensor has a piezoelectric foil polarized in at least in one region, a signal electrode arranged at one side of the piezoelectric foil, and comprises a shell electrode arranged at the other side of the piezoelectric foil. The piezoelectric foil, the signal electrode and the shell electrode are component parts of a multilayer structure wherein the signal electrode and the shell electrode are separated from the piezoelectric foil by a dielectric coupling layer, and the signal electrode and the polarized region of the piezoelectric foil overlap in a region forming a pressure-sensitive sensor surface.

14 Claims, 2 Drawing Sheets

PRESSURE WAVE SENSOR

BACKGROUND OF THE INVENTION

1. Field of the Invention

The present invention is directed to an ultrasound sensor, particularly for shockwave measurements, of the type having comprising a piezoelectric foil, a signal electrode and a shell electrode.

2. Description of the Prior Art

Such ultrasound sensors of the above type are suited both for local pressure measurement and for field measuring in ultrasound fields. The sensors, however, must thereby meet a number of demands. Namely, the sensors must have an adequately high, upper limit frequency, an adequately long service life, particularly when measuring focused shockwaves, and an adequately high sensitivity for the field measurement.

An ultrasound sensor that essentially meets these demands is disclosed in European Application 0 227 985. In this ultrasound sensor, the shell electrode and the signal electrode are arranged spatially separated from the piezoelectric foil, whereby coupling of the alternating charge signal generated by the action of the ultrasound, or shockwaves from the piezoelectric foil onto the electrodes ensues through a liquid. Dependent on whether the liquid is a dielectric liquid or an electrolyte, the signal coupling thereby ensues capacitatively or via the series (intermediate) resistance formed by the liquid. A disadvantage of this known ultrasound sensor is that the sensitivity of the sensor, particularly for sonic field measurements, is not adequate in all cases because of the relatively large distance between the piezoelectric foil and the electrodes. Another disadvantage is that falsifications of the measured results can occur due to non-linear compression properties of the liquid situated between the piezoelectric foil and the electrodes, due to cavitation effects in this liquid and due to positional variations. The presence of liquid between the piezoelectric foil and the electrodes can be avoided when, as disclosed in European Application 0 351 285, electrodes are deposited on both sides of the piezoelectric foil, these electrodes completely covering that surface of the piezoelectric foil to which they are allocated. Based on the teachings of U.S. Pat. No. 4,911,172, moreover, there is the possibility of gluing the piezoelectric foil to an electrode with a thin adhesive layer, whereby the electrical connection ensues by capacitative coupling through the adhesive layer. Both types of sensor, however, have inadequate service lives when charged with high-intensity shockwaves.

SUMMARY OF THE INVENTION

An object of the present invention is to provide an ultrasound sensor of the type having a piezoelectric foil, a signal electrode and a shell electrode, which meets the aforementioned demands, and wherein the disadvantages involved with the presence of a liquid between the electrodes and the piezoelectric foil are avoided and the conditions are created for being able to realize ultrasound sensors with sensitivity matched to the respective application.

This object is achieved in accordance with the principles of the present invention by an ultrasound sensor, particularly for shockwave measurements, that has a piezoelectric foil polarized in at least one region, a signal electrode arranged at one side of the piezoelectric foil and a shell electrode arranged at the other side of the piezoelectric foil, with a dielectric coupling layer between the signal electrode and the piezoelectric foil and/or between the shell electrode and the piezoelectric foil. The piezoelectric foil, the signal electrode, the shell electrode and the coupling layer are component parts of a multilayer structure and the signal electrode and the polarized region of the piezoelectric foil overlap in a region that forms the pressure-sensitive sensor surface. The coupling layer is separated both from the piezoelectric foil and from the signal electrode, from the shell electrode, by a thin layer of an acoustic coupling material, this thin layer being a part of the multilayer structure.

As a consequence of the fact that the piezoelectric foil, the signal electrode and the shell electrode are component parts of a multilayer structure, the ultrasound sensor of the invention has a rugged structure and is therefore for shockwave measurements. At the same time, the problems involved with the presence of liquids between the electrodes and the piezoelectric foil are avoided as a consequence of the multilayer structure since the capacitive tap of the surface charges ensues through the coupling layer or layers. The sensitivity of the ultrasound sensor of the invention can be easily adapted to requirements in that the spacings between the signal electrode, or shell electrode, and the piezoelectric foil within the multilayer structure are selected in accord with the respective requirements on the basis of a suitable thickness of the coupling layer (layers). A smaller spacing leads to a higher sensitivity.

Decreasing the thickness of the coupling layer (layers), however, is causes a shortening of the service life of the ultrasound sensor of the invention since the elastic resiliency of the coupling layer (layers) is an important protective function in that this layer (layers) attenuates the elastic shock energy of the shockwaves as a consequence of its elastic resiliency. The thickness of the coupling layer (layers) should therefore correspond to at least twice, preferably at least five times the thickness of the piezoelectric foil. The material of the coupling layer (layers) preferably has an acoustic impedance matched to that of that medium wherein the ultrasound sensor is to be utilized, since signal falsifications as a consequence of reflections at the boundary surfaces of the coupling layer (layers) are then largely suppressed.

A further advantage of the ultrasound sensor of the invention is that the size of the sensor surface and the topical resolution obtainable given measurements with the ultrasound sensor of the invention can thus be easily adapted to requirements by suitable selection of the dimensions and the shape of that region wherein the signal electrode and the piezoelectric foil overlap. High upper limit frequencies of the ultrasound sensor of the invention can be realized without as a consequence of employing a piezoelectric foil that is extremely thin (10 μm). The layer that separates the coupling layer both from the piezoelectric foil as well as from the signal or shell electrode serves the purpose of acoustically coupling that layer of the multilayer structure adjoining it. The layer should have a thickness that is noticeably less, for example five times and preferably ten times less, than the thickness of the piezoelectric foil that is the determining factor for the upper limit frequency of the ultrasound sensor in order to be able to suppress injurious acoustic influences. Silicone rubber is particularly suited as material for the layer. This material effects the required acoustic coupling of the layers to one another, and silicone rubber can also contribute to or completely effect the mechanical cohesion of the adjoining layers of the multilayer structure as a consequence of its adhesive properties.

Preferably, at least the signal electrode or the shell electrode is provided with an elastically resilient, preferably electrically insulating cover layer as a component part of the multilayer structure. As a result of this measure, a further improvement in the protection of the ultrasound sensor against the action of shockwaves is achieved, since protection for the electrode (electrodes) is also established. The protective effect increases with the thickness of the cover layer, but the upper limit frequency of the ultrasound sensor decreases with increasing thickness of the cover layer as a consequence of increasing attenuation of the high-frequency acoustic signal parts. For the reasons set forth in conjunction with the coupling layer (layers), the cover layer is also preferably a material whose acoustic impedance is matched to that of the medium wherein the ultrasound sensor is utilized.

Experimental investigations have shown that the product of sensitivity and service life of the sensor is approximately constant given variations of the sum of the thicknesses of the coupling layer (layers) and of the cover layer (layers). Ultrasound sensors that have an extremely high sensitivity as required, for example, for ultrasound field measurements, measurements of unfocused shockwaves or measurements of focused shockwaves outside of their focal zone can thus be realized without difficulty. That such high-sensitivity ultrasound sensors have only a comparatively short service life in the focal zone of extremely high-energy shockwaves is insignificant since shockwave sensors of the invention can be manufactured without difficulty with a durability adequate for this application. These, however, have a comparatively low sensitivity, but this does not represent a disadvantage in view of the high pressure amplitudes of high-energy shockwaves.

In an especially advantageous embodiment of the invention, the signal electrode and the piezoelectric foil each have a strip-shaped design and are arranged crossing one another. The simple shape of the foil and of the signal electrode enables a simple manufacture and an unproblematic assembly of the ultrasound sensor. In another especially advantageous embodiment of the invention the ultrasound sensor includes a carrier member for the multilayer structure provided with a curved end face, the sensor surface being situated in the region of the curved end face. It is then possible to manufacture the multilayer structure in an extremely simple way, in that the individual components are glued to one another on the carrier member. Glue layers that are uniform and free of gas bubbles, which are essential for a faultless function of the ultrasound sensor, can be produced in an extremely easy way in the region of the sensor surface as a consequence of the curved end face of the carrier member.

According to a preferred embodiment of the invention, the component parts of the multilayer structure are wound overlapping one another onto the carrier member, which is preferably substantially cylindrical. A helix-like arrangement of the component parts of the multilayer structure is achieved which, as a consequence of the fact that the component parts of the multilayer structure can be wound onto the carrier member and glued to one another upon exertion of a tensile force, enables the manufacture of the required homogeneous glue layers free of gas bubbles in a reliable and even simpler way.

It is understood that materials whose acoustic impedance corresponds as exactly as possible to the acoustic impedance of that medium wherein the ultrasound waves or shockwaves to be measured propagate are preferably employed for the components of the ultrasound sensor, in order to avoid disturbing reflections at boundary surfaces. Components of the ultrasound sensor having highly divergent acoustic impedance should have a thickness in the sound propagation direction that lies noticeably below the shortest wavelength to be measured.

DESCRIPTION OF THE PREFERRED EMBODIMENTS

Figure 1:
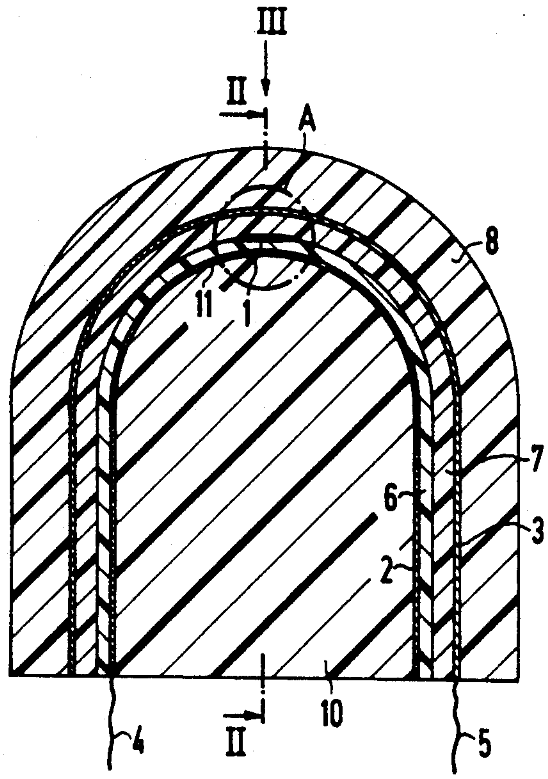
FIGS. 1 and 2 are schematic views of respective longitudinal sections through an ultrasound sensor constructed in accordance with the principles of the present invention taken along the lines I—I and II—II in FIG. 3.

As its most important element, the ultrasound sensor of FIGS. 1 through 4 has a foil strip 1 of a piezoelectric, polymeric material. The foil strip 1 is polarized over its entire length. Ultrasound waves or shockwaves incident on the foil strip 1 (the direction of sound incidence having the maximum sensitivity for the ultrasound sensor corresponds to the direction of the arrow III in FIG. 1) produce surface charge oscillations at the foil strip 1 whose chronological curve corresponds to that of the ultrasound or shockwaves. These surface charge oscillations are obtained with the assistance of a signal electrode 2 that is likewise strip-shaped, and of a large-area shell electrode 3. These signals are supplied via lines 4 and 5 respectively connected to the electrodes 2 and 3 to a suitable amplifier (not shown) at whose output an amplified signal that reproduces the chronological curve of the surface charge oscillations is available. The surface charge oscillations are obtained capacitatively since a respective coupling layer 6 or 7 of a dielectric material is provided both between the signal electrode 2 and the foil strip 1 and between the foil strip 1 and the shell electrode 3. The shell electrode 3 is provided with an elastic, electrically insulating cover layer 8.

Figure 3:
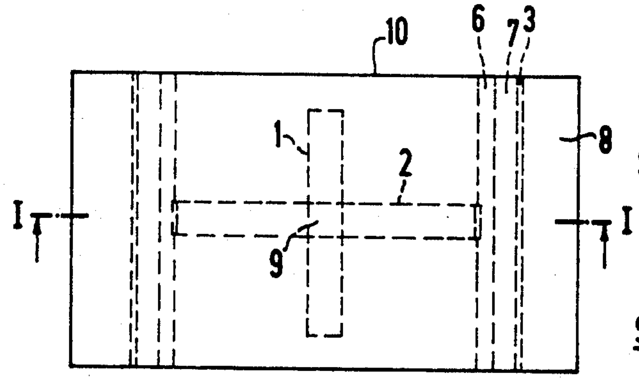
FIG. 3 is a view of the ultrasound sensor as seen in the direction of the arrow III in FIG. 1.

As may be particularly seen from FIG. 3, the strip-shaped signal electrode 2 crosses the foil strip 1 at an angle of 90°, so that the foil strip 1 and the signal electrode 2 overlap in a small area whose surface area derives from the product of the width of the foil strip 1 and the width of the signal electrode 2. This region constitutes a sensor surface 9 that is pressure-sensitive for negative pressure as well as for positive pressure.

Figure 4:
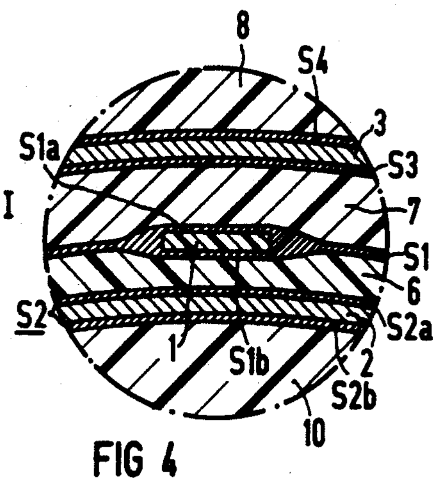
FIG. 4 shows detail A in FIG. 1 enlarged.

The cover layer 8, the shell electrode 3, the coupling layer 7, the foil strip 1, the coupling layer 6 and the signal electrode 2 form a multilayer structure that is applied to a carrier member 10 having a quadratic cross section and having an end face 11 that is convexly curved around an axis proceeding parallel to the center axis of the foil strip 1. The sensor surface 9 is situated in the region of this end face 11. The multilayer structure (the thicknesses of the individual layers being shown exaggerated in FIGS. 1 through 4 for clarity) is preferably manufactured, beginning with the signal electrode 2 being glued onto the carrier member 10 with a suitable adhesive, with the individual elements of the ultrasound sensor joined to one another with suitable adhesives in the sequence and arrangement seen from FIGS. 1 and 2. The curved end face 11 of the carrier member 10 facilitates attachment of the individual layers and the production of glue layers that are uniform and free of gas bubbles in the region of the sensor surface 9. The adhesive layers referenced S1 through S4 are shown in FIG. 4. The piezoelectric foil 1 is embedded into the adhesive layer S1 such that the piezoelectric foil 1 is separated both from the coupling layer 6 and from the coupling layer 7 by an adhesive layer S1*a* through S1*b*. The adhesive layer S2, into which the signal electrode 2 is embedded in a way similar to that by which the piezoelectric foil is embedded in the adhesive layer S1, is situated between the coupling layer 6 and the carrier member 10. The signal electrode 2, consequently, is separated from the coupling layer 6 by the adhesive layer S2*a* and from the carrier member 10 by the adhesive layer S2*b*. The adhesive layer S3 is situated between the shell electrode 3 and the coupling layer 7. The adhesive layer S4 is provided between the shell electrode 3 and the cover layer 8. It is apparent that the thickness of the adhesive layers are shown exaggerated in FIG. 4 relative to the thicknesses of the other component parts.

The large-area shell electrode 3 which, as the cover layer 8 and the coupling layers 6 and 7, extends over the entire width B of the carrier member 10, serves the purpose of electrically shielding the ultrasound sensor in addition to serving its function as an electrode.

The foil strip 1 is preferably composed of polyvinylidene fluoride (PVDF). Other piezoelectrically activatable polymer foils, however, may be used. The thickness of the foil strip 1 critically determines the upper limit frequency of the sensor and should not significantly exceed 100 μm in order to measure shockwaves having extremely steep pulse edges, whose rise times can lie below 1 microsecond. In implemented prototypes, the width of the foil strip amounts to between 1 and 2 mm.

The materials of the coupling layers 6 and 7, of the cover layer 8 and of the carrier member 10 should be insensitive to shockwaves, i.e. should be elastically resilient and should have acoustic impedances matched to the acoustic impedance of that medium wherein the measurements with the ultrasound sensor ensue and wherein the ultrasound waves or shockwaves consequently propagate. For example, soft rubber or soft PVC are suitable as materials for measurements in water. The acoustic impedance of these materials can be set by the softener content, the acoustic impedance decreasing with increasing softener content. These materials also have good dielectric properties. The thicknesses of the coupling layers 6 and 7 should not significantly exceed 1000 μm, since the sensitivity of the ultrasound sensor would otherwise become too low as a consequence of what would then be the relatively great distance between the signal electrode 2 and the shell electrode 3. Prototypes have been realized whose sensitivity amounts to 15 mV/MPa, or 340 mV/MPa, dependent on the thickness of the coupling layers 6 and 7. The thickness of the cover layer 8 should not significantly exceed 2000 μm since a limitation of the measurable rise steepness given shockwaves, or of the upper limit frequency given ultrasound waves, would otherwise appear due to an increasing attenuation of high-frequency signal components. In order to assure that they can meet their protective function, the coupling layers 6 and 7 should each be at least, for example, twice and preferably at least five times, as thick as the piezoelectric foil 1 employed, and the cover layer 8, for example, should be at least four times, and preferably at least ten times, as thick as the piezoelectric foil 1 employed.

Thin stainless steel foil that also has adequate electrical conductivity is suitable as the material for the signal electrode 2 and for the shell electrode 3 because of its good resistance to corrosion and shockwaves. However, foils of other electrically conductive materials whose resistance is comparable to that of stainless steel foils can also be employed. When employing stainless steel foils, their thickness should not significantly exceed the thickness of the piezoelectric foil 1, and, thus, should not significantly exceed a maximum of 100 μm since the thickness of the signal electrode 2 and of the shell electrode 3 is then so small in comparison to the wavelength corresponding to the upper limit frequency of the ultrasound sensor that no deteriorations due to reflections are expected. In executed prototypes, the width of the signal electrode amounts to between 1 and 2 mm.

Silicon rubber, for example, is suitable as an adhesive for joining the individual layers, silicone rubber having an acoustic impedance approximately matched to water. The thickness of the adhesive layers S1, S1*a*, S2, S2*a*, S2*b*, S3 and S4, that are only shown in FIG. 4 and that are present between the individual layers, should be noticeably less than the thickness of the layer to be glued (for example, at least by a factor of five, and preferably ten). The adhesive layers S1, S1*a*, S1*b*, S2, S2*a*, S2*b*, S3 and S4 secure the cohesion of the multilayer structure. They also serve the purpose of acoustic coupling between layers of the multilayer structure neighboring one another, and must therefore be free of gas bubbles. This is particularly true of the adhesive layers S1*a* and S1*b* that effect the acoustic coupling of the piezoelectric foil 1 to the coupling layers 6 or 7.

Apart from the important advantage that the disclosed sensor is extremely rugged as a consequence of its multilayer structure applied on the carrier member 10, it has the additional important advantage that its physical properties are largely dependent on geometrical quantities and therefore can be influenced by simple structural measures.

Thus, the widths of the foil strip 1 and of the signal electrode 2 influence the topical resolution, the directional characteristic and the sensitivity of the ultrasound sensor. The topical resolution increases with decreasing width of the said elements whereas the sensitivity decreases. The directional characteristic of the ultrasound sensor is dependent on the ratio of the widths of the foil strip 1 and of the signal electrode 2 relative to one another and on the crossing angle of these elements.

The service life, the sensitivity and, to a certain extent, the upper limit frequency of the ultrasound sensor are dependent on the thicknesses of the coupling layers 6 and 7. With increasing thickness of the coupling layers 6 or 7, the service life of the ultrasound sensor increases, whereas its sensitivity decreases. The upper limit frequency decreases with increasing thickness of the coupling layers 6 or 7 since high-frequency signal components are subjected to a higher acoustic attenuation in these layers than are comparatively low-frequency signal components.

Sensors having properties customized for specific applications can thus be manufactured without difficulty.

In a departure from the exemplary embodiments set forth above, the carrier member 10 may have a circular cross section. The end face 11 of the carrier member that carries the multilayer structure then has the shape of a hemisphere.

The exemplary embodiments shown in FIGS. 5 through 8 differs from that set forth above in that, first, a cylindrical carrier member 12 is provided onto which the component parts of the multilayer structure are helically wound overlapping one another. Consequently, the signal electrode 13 is wound on the carrier member 12 first, whereby the signal electrode 13 wraps the carrier member 12 at an angle of somewhat more than 180°. First, the left end of the signal electrode 13 in FIG. 5, which is strip-shaped analogous to the signal electrode 2 is glued to the carrier member 12. After allowing the glue between the signal electrode 13 and the carrier member 12 to set, one end of coupling strip 14 is glued to the carrier member 12 and to the signal electrode 13 such that it overlaps the right end of the signal electrode 13 in FIG. 5 by an angle of, for example, 15° through 30°. After allowing this glue to set, the coupling strip 14 (which, differing from the signal electrode 13, extends over the entire width of the carrier member 12) is wound with a suitable adhesive around the carrier member 12, provided with the signal electrode 13, in barely two turns while exerting tension. A metal strip 15 that serves as a terminal for the signal electrode 13 is wound between the first turn of the coupling strip 14 and the signal electrode 13 in the region of the left end of the signal electrode 13 in FIG. 5. The metal strip 15 projects laterally beyond the carrier member 12. In order to achieve a faultless electrically conductive connection of the metal strip 15 to the signal electrode 13, care must be exercised so that no glue is present between the two.

Figure 8:
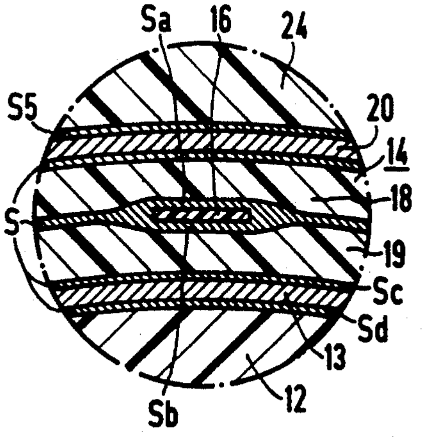

The piezoelectrically activated foil strip 16 is then placed between the first and the second turn of the coupling strip 14, this foil strip 16 being arranged such that it crosses the strip-shaped signal electrode 13 at an angle of 90°, with the center axis of the foil strip 16 proceeding parallel to the center axis of the cylindrical carrier member 12. That region wherein the signal electrode 13 and the foil strip 16 overlap is again a sensor surface 17 of the ultrasound sensor that is pressure-sensitive for negative pressure as well as for positive pressure, and is situated in the region of the generated surface of the cylindrical carrier member 12. The two turns of the coupling strip 14 form coupling layers 18 and 19 that correspond to the coupling layers 6 and 7 in the case of the exemplary embodiment set forth earlier. The shell electrode 20 extending over the entire width of the carrier member 12 is wound in a substantially complete turn around the two turns of the coupling strip 14. This is done by first gluing one end of the shell electrode 20 to the end of the second turn of the coupling strip 14. After allowing this glue to set, the shell electrode 20, which extends over the entire width of the carrier member 12, is wound around the outer turn of the coupling strip 14 with an adhesive while exerting tension. A second metal strip 21, serving as electrical terminal for the shell electrode 20, is wound between this shell electrode 20 and the outer turn of the coupling strip 14. Like the metal strip 15, the metal strip 21 projects laterally beyond the carrier member 12. In order to guarantee a faultless electrical contact, no adhesive can be situated between the metal strip 21 and the shell electrode 20. As shown in FIG. 8, that shows the detail B of FIG. 5, the glue layers form a single, helical adhesive layer S into which the signal electrode 13 and the piezoelectrically activated foil strip 16 are embedded in a way similar to that in the exemplary embodiment set forth earlier. The foil strip 16 is thus separated from the coupling layer 18 by the adhesive layer S*a* and is separated from the coupling layer 19 by the adhesive layer S*b*. The adhesive layers S*c* and S*d* respectively separate the signal electrode 13 from the coupling layer 19 or from the carrier member 12.

Given exact knowledge of the required length of the layers, the layers 13, 14 and 20 can also be beneficially glued to one another at their overlap locations before being wound onto the carrier member 12. The "layer chain" created in this way can then be wound onto the carrier member 12 in one operation while adding adhesive and while exerting tension without having to wait for the adhesive to set.

The described multilayer structure is joined to a substantially cuboid retainer part 22 by an adhesive layer S5 situated between the shell electrode 20 and the retainer part 22. The retainer part 22, whose width corresponds to that of the carrier member 12, has a concave recess 23 at one end face for accepting the multilayer structure. Gluing of the multilayer structure to the retainer part 22 ensues between the shell electrode 20 and the surface of the recess 23.

In the region of the sensor surface 17, the multilayer structure also has a cover layer 24 extending over the entire width of the carrier member 12, the region of this cover layer 24 that wraps the shell electrode 20 being glued to the latter. The free ends of the cover layer 24 are glued to those lateral surfaces of the retainer part 22 that lie opposite one another.

Figure 2:
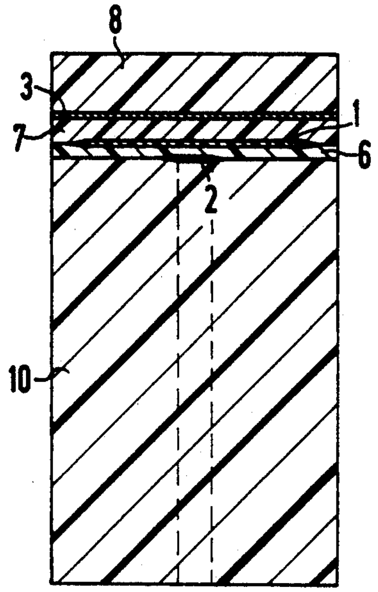

The functions, dimensions and materials of the individual layers of the ultrasound sensor of FIGS. 4 through 8 agree with those of the ultrasound sensor of FIGS. 1 through 3. The function of the adhesive layers S, S*a*, S*b*, S*c*, S*d*, S5 also corresponds to the function of the corresponding adhesive layers of the above-described exemplary embodiment. For example, silicone rubber is suitable as an adhesive for joining the individual layers. For clarity, the adhesive layers present between the individual layers are not shown in FIGS. 5 through 7. The adhesive that is situated in the gaps shown in FIGS. 5 and 6 in the region of the signal electrode 13, of the foil strip 16, of the metal strips 15 and 21 and the ends of the coupling strip 14 (that are extremely narrow in practice) is also not shown in the figures for clarity, but is shown in FIG. 8 with reference to the example of the foil strip 16. As a consequence of the fact that thicknesses of the individual layers are shown exaggerated in FIGS. 5 through 8, the multilayer structure in practice has portions that are not precisely hemispherical, but the departure is slight compared to those shown in FIG. 5. The thicknesses of the adhesive layers are again shown exaggerated in comparison to the thicknesses of the other layers in FIG. 8.

Figure 5:
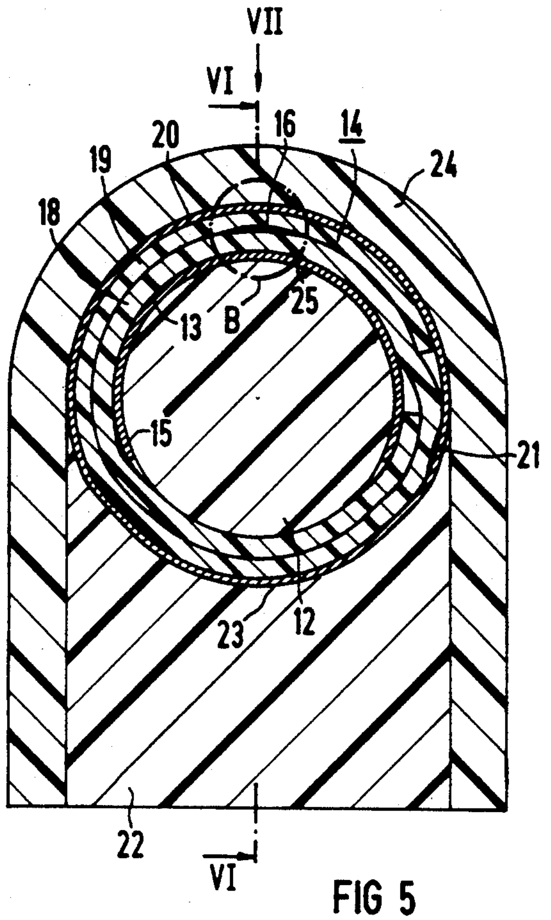
FIGS. 5 through 8 show a further embodiment of an ultrasound sensor constructed in accordance with the principles of the present invention in views analogous to FIGS. 1 through 4.
Figure 6:
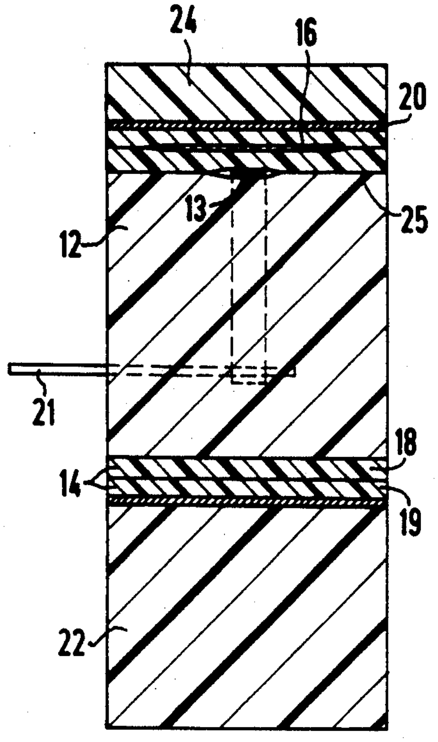
Figure 7:
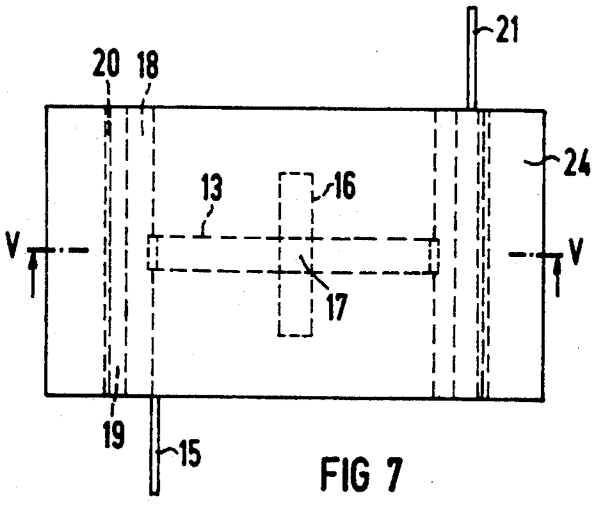

Differing from that shown in FIGS. 5 through 7, there is also the possibility of executing the cover layer 24 such that it completely wraps the shell electrode 20. In this case, fastening of the multilayer structure to the retainer part 22 would ensue with glue between the cover layer 24 and the surface of the recess 23 adapted to the curvature radius of the cover layer 24.

Differently shaped carrier members can also be provided instead of the cylindrical carrier member 12. It is important, however, is that these carrier members have a convexly curved surface in the region of the sensor surface 17, so that no air bubbles can arise in the region of the sensor surface 17 when winding the component parts of the multilayer structure onto the carrier member. Avoiding air bubbles and creating a uniform gluing are especially promoted by the exertion of tension that is continuously possible in the case of the ultrasound sensor of FIGS. 4 through 8 when winding the individual layers.

The advantages set forth in conjunction with the ultrasound sensor of FIGS. 1 through 4 apply analogously to that just set forth.

In a departure from the exemplary embodiments set forth above, the ultrasound sensor can be executed as a self-supporting multilayer structure. A component part comparable to the carrier member 10 is then superfluous.

The foil strip 1 need not be polarized overall. It is adequate if a sufficiently large, piezoelectrically activated foil region is present in that region wherein foil strip 1 and signal electrode 2 cross.

If the mechanical cohesion of the multilayer structure is secured in some other way, adhesive layers need not necessarily be present between the layers. Layers of a viscus, non-adhesively acting material having suitable acoustic properties can be used, particularly between the coupling layers and the piezoelectric foil as well as the signal electrode or the shell electrode.

Although modifications and changes may be suggested by those skilled in the art, it is the intention of the inventor to embody within the patent warranted hereon all changes and modifications as reasonably and properly come within the scope of his contribution to the art.

I claim as my invention:

1. A pressure wave sensor comprising:

a piezoelectric foil having a polarized region;

a signal electrode disposed at one side of said piezoelectric foil;

a shell electrode disposed at a further side of said piezoelectric foil opposite said one side;

an elastically resilient, dielectric coupling layer disposed between said piezoelectric foil and one of said electrodes;

two thin layers of acoustic coupling material respectively disposed between said piezoelectric foil and said coupling layer and between one of said electrodes and said coupling layer;

said signal electrode and said polarized region of said piezoelectric foil overlapping to form a pressure-sensitive sensor surface; and said piezoelectric foil, said signal electrode, said shell electrode, said coupling layer and said layers of acoustic coupling material being joined to form a unitary multi-layer structure.

2. A pressure wave sensor as claimed in claim 1 further comprising:

a further elastically resilient, dielectric coupling layer disposed between said piezoelectric foil and the other of said electrodes;

two further thin layers of acoustic coupling material respectively disposed between said piezoelectric foil and said further coupling layer and between said other of said electrodes and said further coupling layer; and said further coupling layer and said further layers of acoustic coupling material being joined with said piezoelectric foil, said signal electrode, said shell electrode, said coupling layer and said layers of acoustic coupling material in said unitary multi-layer structure.

3. A pressure wave sensor as claimed in claim 1 further comprising an elastically resilient cover layer, forming a component of said unitary multi-layer structure, adjacent one of said electrodes.

4. A pressure wave sensor as claimed in claim 3 further comprising a further elastically resilient cover layer, forming a component of said unitary multi-layer structure, adjacent the other of said electrodes.

5. A pressure wave sensor as claimed in claim 1 wherein said signal electrode and said piezoelectric foil are each in the form of a strip, and are disposed crossing each other.

6. A pressure wave sensor as claimed in claim 1 wherein at least one of said electrodes consists of an electrically conductive foil of shockwave-resistant material.

7. A pressure wave sensor as claimed in claim 6 wherein said foil consists of stainless steel.

8. A pressure wave sensor as claimed in claim 1 wherein said piezoelectric foil consists of polyvinylidene fluoride.

9. A pressure wave sensor as claimed in claim 1 wherein said coupling layer consists of soft rubber.

10. A pressure wave sensor as claimed in claim 1 wherein said coupling layer consists of soft polyvinyl chloride.

11. A pressure wave sensor as claimed in claim 1 wherein said layers of acoustic coupling material consist of silicone rubber.

12. A pressure wave sensor as claimed in claim 1 further comprising:

a carrier member having a convexly curved surface on which said multi-layer structure is disposed, said sensor surface being situated in the region of said curved surface.

13. A pressure wave sensor as claimed in claim 12 wherein said carrier member is substantially cylindrical, and wherein the components of said multi-layer structure are wound helically overlapping each other onto said carrier member.

14. A pressure wave sensor comprising:

a piezoelectric foil having a polarized region;

a signal electrode disposed at one side of said piezoelectric foil;

a shell electrode disposed at a further side of said piezoelectric foil opposite said one side;

a first elastically resilient, dielectric coupling layer disposed between said piezoelectric foil and said signal electrode;

a second elastically resilient common dielectric coupling layer disposed between said piezoelectric foil and said shell electrode;

a layer of acoustic coupling material disposed between said first and second coupling layers with said piezoelectric foil embedded in said layer of acoustic coupling material so that two thin layers of acoustic coupling material are respectively disposed on opposite sides of said piezoelectric foil between said piezoelectric foil and each of said first and second coupling layers;

said signal electrode and said polarized region of said piezoelectric foil overlapping to form a pressure-sensitive sensor surface; and said piezoelectric foil, said signal electrode, said shell electrode, said first and second coupling layers and said layer of acoustic coupling material being joined to form a unitary multi-layer structure.

* * * * *